United States Patent [19]

Chung et al.

[11] Patent Number: 4,841,174
[45] Date of Patent: Jun. 20, 1989

[54] CMOS CIRCUIT WITH RACEFREE SINGLE CLOCK DYNAMIC LOGIC

[75] Inventors: Randall M. Chung, Laguna Niguel; Bradley S. Masters, Chino, both of Calif.

[73] Assignee: Western Digital Corporation, Irvine, Calif.

[21] Appl. No.: 13,694

[22] Filed: Feb. 12, 1987

Related U.S. Application Data

[63] Continuation-in-part of Ser. No. 789,383, Oct. 21, 1985, Pat. No. 4,740,721.

[51] Int. Cl.$^4$ .................. H03K 19/094; G06F 7/38
[52] U.S. Cl. .................................. 307/469; 307/443; 307/452; 340/825.83
[58] Field of Search ............. 307/443, 452, 468–469, 307/481; 340/825.83; 364/716

[56] References Cited

U.S. PATENT DOCUMENTS

3,974,366  8/1976  Hebenstreit .................... 307/468

FOREIGN PATENT DOCUMENTS

0081317   6/1983  European Pat. Off. .
2544434   4/1977  Fed. Rep. of Germany .
3635761   4/1987  Fed. Rep. of Germany .
54-11651  1/1979  Japan .
58-191530 11/1983 Japan .
59-47845  3/1984  Japan .

OTHER PUBLICATIONS

Weste, et al.: "Principles of CMOS VLSI design", 1985, pp. 203–224.

*Primary Examiner*—John S. Heyman
*Assistant Examiner*—M. R. Wambach
*Attorney, Agent, or Firm*—Spensley Horn Jubas & Lubitz

[57] ABSTRACT

Disclosed is an improved logic circuit employing dynamic CMOS logic and having alternating logic employing first and second conductivity type transistors, respectively, separated by clocked inverters. The circuit employs a single clock signal to synchronize the dynamic logic operations of said logic gates and, along with a second, complement clock signal, said clocked inverters. Precharge transistors of each conductivity type are slowed slightly with respect to logic transistors, and the complement clock signal is delayed slightly with respect to the clock signal, thereby providing racefree logic operations. An implementation in a PLA is disclosed employing two logic planes for implementing arbitrary logic equations on input logic signals. The first logic plane and second logic plane are evaluated on separate phases of a complement clock signal and are separated by a clocked latch/inverter for providing correct logic evaluation between the logic planes.

10 Claims, 3 Drawing Sheets

CMOS CIRCUIT WITH RACEFREE SINGLE CLOCK DYNAMIC LOGIC

RELATED APPLICATIONS

This is a continuation in part of Ser. No. 06/789,383 filed Oct. 21, 1985.

BACKGROUND OF THE INVENTION

1. Field of the Invention

The present invention relates to solid state circuits employing digital logic. More particularly, the present invention relates to dynamic logic circuits employing CMOS field effect transistors.

2. Background of the Invention

In designing complementary metal oxide semiconductor (CMOS) circuits, especially in VLSI applications, the space required for CMOS logic offsets some of the other advantages of CMOS circuitry. This is due to the general requirement in CMOS logic of using equal numbers of n and p channel transistors in designing ratioless CMOS logic gates. In general an N input logic gate implemented in CMOS will have 2N transistors, N p type and N n type transistors. This results in considerable extra area required in the chip. Ratioed CMOS logic only requires N+1 transistors, typically N n type and one p type, but power is consumed even when the logic circuit is not switching. One technique which has been used to relax this requirement and reduce chip size utilizes a clock to control the operation of the logic gates. Such clocked logic is referred to as dynamic logic. Dynamic logic is described, for example, in William M. Penney, Lillian Lau, eds., *MOS Integrated Circuits*, Van Nostrand & Co. (1972), pp. 260-288.

In dynamic logic the logic gates are precharged to a predetermined voltage level during one phase of a clock signal and then during a separate "evaluation" clock phase the logic outputs of the gates are determined or evaluated from the logic inputs. The capacitive storage of charge in the transistors allows the retention of information between the precharge and evaluation clock phases. Since there is no continuous current flow in dynamic logic CMOS circuits, power dissipation is at a much lower level than would otherwise be the case in static ratioed CMOS design. Also, the general static CMOS requirement of equal numbers of n and p type transistors may be relaxed reducing the number of transistors per logic gate and reducing chip area.

One example of a complex circuit where dynamic logic has been employed is the programmable logic array (PLA). Programmable logic arrays are a well-known method of implementing logic in complex digital circuits. Programmable logic arrays typically have a two "plane" structure, i.e. two separate regions or groupings of logic gates with the outputs from one region leading into the other. For example, a typical PLA comprises a plane of AND gates which leads into a plane of OR gates. Equivalently, the AND and OR planes may be implemented using NAND gates and inverters in one plane and NOR gates and inverters in the other plane. This type of two-plane PLA allows a large number of arbitrary logic equations to be implemented in an orderly manner. The orderly structure of PLAs is particularly advantageous in designing large scale integrated (LSI) or very large scale integrated (VLSI) systems.

The programming of a PLA may be achieved in several different ways. For example, in mask-programmable PLAs the logic array may be built up on an integrated circuit chip using several masks in the formation of the chip. The final logic connections are left to one or two mask steps which can be relatively easily modified. Other more flexible systems, sometimes referred to as field programmable PLAs, use fuses which can be blown or electrically programmable transistors to allow programming after chip manufacture.

A drawback of dynamic logic, especially in complex circuits, such as PLAs, is that correctly synchronizing the precharge and evaluation functions of a dynamic CMOS circuit can raise difficult timing and design problems. One type of timing problem which can arise in dynamic CMOS logic circuits is the so-called clock race problem which arises due to overlap of clock phases since ideally synchronized square-wave clock signals are not possible in practice. One approach to avoiding such clock race conditions is the NORA (NO RAce), or n-p CMOS, dynamic logic technique. Nelson F. Goncalves, Hugo J. DeMan, *NORA: A Racefree Dynamic CMOS Technique for Pipelined Logic Structures*, IEEE J. Solid-State Circuits, Vol. SC-18, No. 3 (June 1983).

This CMOS dynamic logic technique does not ensure absence of other types of race problems in the circuit, however. Also, other design problems, such as charge sharing, may be present in complex dynamic CMOS circuits. These disadvantages are discussed, e.g. in David J. Myers, Peter A. Ivey, *A Design Style for VLSI CMOS*, IEEE J. Solid-State Circuits, Vol. SC-20, No. 3 (June 1985). That article advocates the use of a four clock phase dynamic logic design. Other four clock logic approaches have also been employed. E.g., Neil Weste, Camran Eshraghin, *Principles of CMOS VLSI Design*, Addison Wesley (1985), p. 215. The use of four clock signals, however, has disadvantages in terms of added clock lines and complicated circuit layout, especially in VLSI circuits.

SUMMARY OF THE INVENTION

The present invention provides an improved dynamic logic design for CMOS digital circuits. In the improved logic design, p channel and n channel logic is alternated, with each p and n channel logic block separated by a clocked inverter. A single clock signal synchronizes the operation of both the n channel and p channel logic and, in combination with the complement of the clock signal, the timing of the clocked inverters. In both p channel and n channel logic blocks, the timing is controlled by clocked precharge and evaluate transistors which receive the clock signal. The precharge transistors are designed to be slightly slower than the transistors employed for the logic operations to avoid one type of potential "race" condition. Additionally, the single clock signal and its complement are provided with a slight delay between their respective transition edges. This delay may be provided by generating one of the two clock signals from the other by a series of three inverters. This avoids a second type of potential race condition. The logic design thus provides racefree CMOS dynamic logic operation.

In one illustrative embodiment of the present invention a programmable logic array is provided employing the improved CMOS dynamic logic. In a preferred embodiment, the PLA employs a two plane logic structure, comprising a NAND gate plane receiving a plurality of inputs, coupled to a NOR gate plane receiving the output from the NAND plane through the clocked inverters. The timing of the PLA is controlled by a single clock signal and a single complement clock signal having clock transitions delayed slightly with respect to the clock signal. The logic operations of both the NAND plane and NOR plane are controlled by the single complement clock signal. The NAND plane and NOR plane are separated by a clocked latch/inverter which receives the clock signal and the complement clock signal and the output signals from the NAND plane. The clocked inverter inverts the NAND plane output signals during a sample cycle and, during the subsequent clock cycle, latches them to allow evaluation by the NOR plane. A second latch/inverter may also be provided at the output of the NOR plane to allow the output from the NOR plane to be latched and optionally fed back into the NAND plane to form a finite state machine. The two latch/inverters receive both the clock signal and the complement clock signal to control the timing of their latch/inversion operations. Solely n channel or p channel logic gates are employed in a single plane, the two planes employing opposite conductivity type transistors; that is, if the NAND plane employs p channel logic gates, the NOR plane employs n channel logic gates. In a preferred embodiment the precharge transistors are formed of long, narrow FETs having correspondingly slower response characteristics than the other FETs in the plane.

DESCRIPTION OF THE PREFERRED EMBODIMENT

The present invention provides an improved dynamic logic design for CMOS circuits. Since programmable logic arrays (PLAs) represent an orderly means for representing general logic structures, the logic design of the present invention will be illustrated implemented in a PLA structure.

Figure 1:
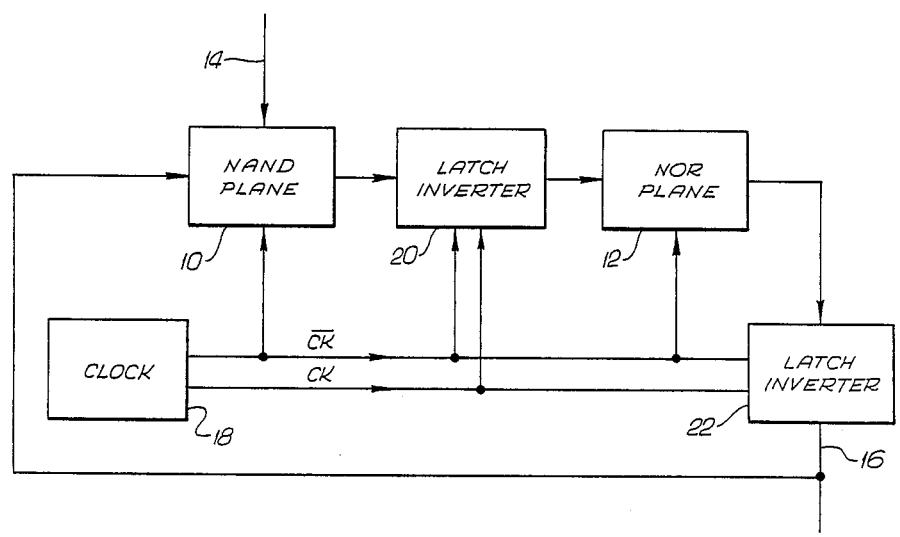
FIG. 1 is a block schematic drawing showing the overall layout of the programmable logic array of the present invention.

Referring to FIG. 1, a preferred embodiment of an improved programmable logic array embodying the present invention is shown in block schematic form. The PLA shown employs two separate planes or arrays of logic gates, illustrated as NAND plane 10 and NOR plane 12, for implementing desired logic equations on input logic signals provided at inputs 14. The combination of a NAND plane feeding into a NOR plane allows implementation of arbitrary logic equations under well known rules of Boolean logic. Other logic gates may also be used; however, for example, an AND plane coupled to an OR plane or a NOR plane coupled to a NAND plane, have equal flexibility for implementing logic equations. NAND plane 10 receives logic signals provided at inputs 14 from circuitry external to the PLA. The PLA performs the desired logic operations on selected ones of the input signals and ultimately provides output logic signals at outputs 16.

The PLA of FIG. 1 employs a clock 18 which provides a single clock signal CK and its complement clock signal $\overline{CK}$. The clock 18 controls the timing of the operation of the PLA. More specifically, clock 18 synchronizes precharging and evaluation of the logic gates in the NAND and NOR logic planes 10, 12, respectively. The logic operations of each plane are controlled by a single clock signal, shown as complement clock signal $\overline{CK}$ in FIG. 1. The precharging and evaluation of NOR plane 12 are carried out during opposite phases of the clock signal $\overline{CK}$ from that of NAND plane 10. Both clock signals CK and $\overline{CK}$ are provided to a first latch-/inverter 20 and second latch/inverter 22. First latch-/inverter 20 receives output signals provided from NAND plane 10 and provides logically inverted signals corresponding thereto. These inverted signals are latched, or held, by the latch/inverter 20. The latched signals are then evaluated as inputs to the NOR plane 12 during the precharge clock phase of NAND plane 10. The clocking of the circuitry in the present invention will be described in more detail in relation to FIGS. 2, 3, 4 and 5.

Figure 2:
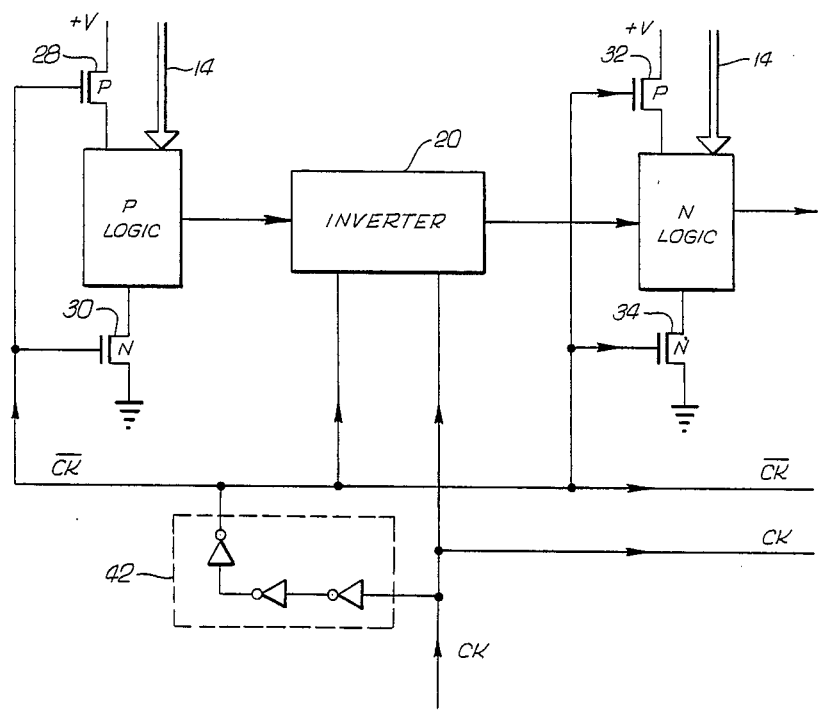
FIG. 2 is a block schematic drawing showing the n and p type device structure of the logic planes shown in FIG. 1.

Referring to FIG. 2, a preferred embodiment of the logic structure of the present invention, as implemented in a PLA, is shown in block schematic form. The two logic planes 24, 26 comprise logic gates of p channel and n channel transistors, respectively. Each plane or block of transistors may contain multiple logic gates, each logic gate implementing a specific logic function on selected input signals. The number of transistors within each gate and the input line connections will depend on the specific logic being implemented by the logic gate. As may be seen from FIG. 2, the timing of the logic operation of the p channel logic 24 is synchronized by the clock signal $\overline{CK}$ as is the timing of the n channel logic 26. Each p channel logic gate within plane 24 employs two clocked transistors illustrated collectively by clocked p transistor 28 and clocked n transistor 30. Depending on the logic function performed, either p transistor 28 or n transistor 30 will be a precharge transistor which precharges the output of the logic gate to a high or low value, respectively. In an embodiment where logic plane 24 is a NAND plane, n channel transistor 30 will be the precharge transistor. The other transistor may be characterized as an evaluate transistor in that it allows the logic state of the gate to be evaluated during the clock phase following the precharge phase. Similarly, in n channel logic plane 26 one of clocked p transistor 32 and clocked n transistor 34 will be the precharge transistor and the other the evaluate transistor. In an embodiment where n channel logic plane 26 is a NOR plane, the precharge transistor will be p channel transistor 32.

It will be appreciated that the general logic layout of FIG. 2 is applicable to other logic circuits and the number of transistors in logic blocks 24, 26 may vary from one to hundreds or thousands. The combination of p type (or n type) transistors followed by clocked inverter, followed by p type (or n type) transistors may be continued in sequence, i.e. n followed by p followed by n, etc., to any desired logical depth. Normally in a PLA design the PLA will have a two plane structure, however.

The p logic/inverter/n logic arrangement shown in FIG. 2 ensures that certain types of clock race problems are avoided in the circuit. For example, in Neil Weste, Camran Eshraghin, *Principles of CMOS VLSI Design,* Addison Wesley (1985), p. 163-171, 203-221, clock race problems in dynamic CMOS logic are discussed. As discussed therein, if certain design rules are followed, these clock race problems may be avoided. These rules have been variously referred to as NORA logic, n-p domino logic or n-p CMOS dynamic logic; Goncalves, et al.; Weste, Eshraghin at p. 215. The logic design shown in FIG. 2 represents a specific subset of this so-called n-p CMOS dynamic logic.

The general application of n-p CMOS dynamic logic has associated therewith several design problems including charge sharing, added circuit complexity, and added transistors for logic gates, however. Also, additional race problems may occur due to the non-ideal characteristics of the transistors. It has been recognized that inherent delays in switching in MOSFET transistors can result in potential race problems even when n-p CMOS design rules are employed. These race conditions arising from non-ideal switching characteristics of the transistors are of two types; the first type may be referred to as "precharge race" conditions since they result from precharge transistors becoming turned on before certain clocked transistors to which they are connected are fully turned off. A second type of race condition, which may be referred to as a "latch sample" race, is due to non-ideal transistor switching in conjunction with non-ideal clock transitions. This type of race may result when a clocked latch/inverter begins its sample cycle before the preceding logic gate has completed its evaluation cycle. Specific examples of both such potential race conditions will be discussed below in relation to the illustrative example of a PLA structure shown in FIG. 3 followed by an explanation of how they are avoided by the circuit design of the present invention.

Figure 3:
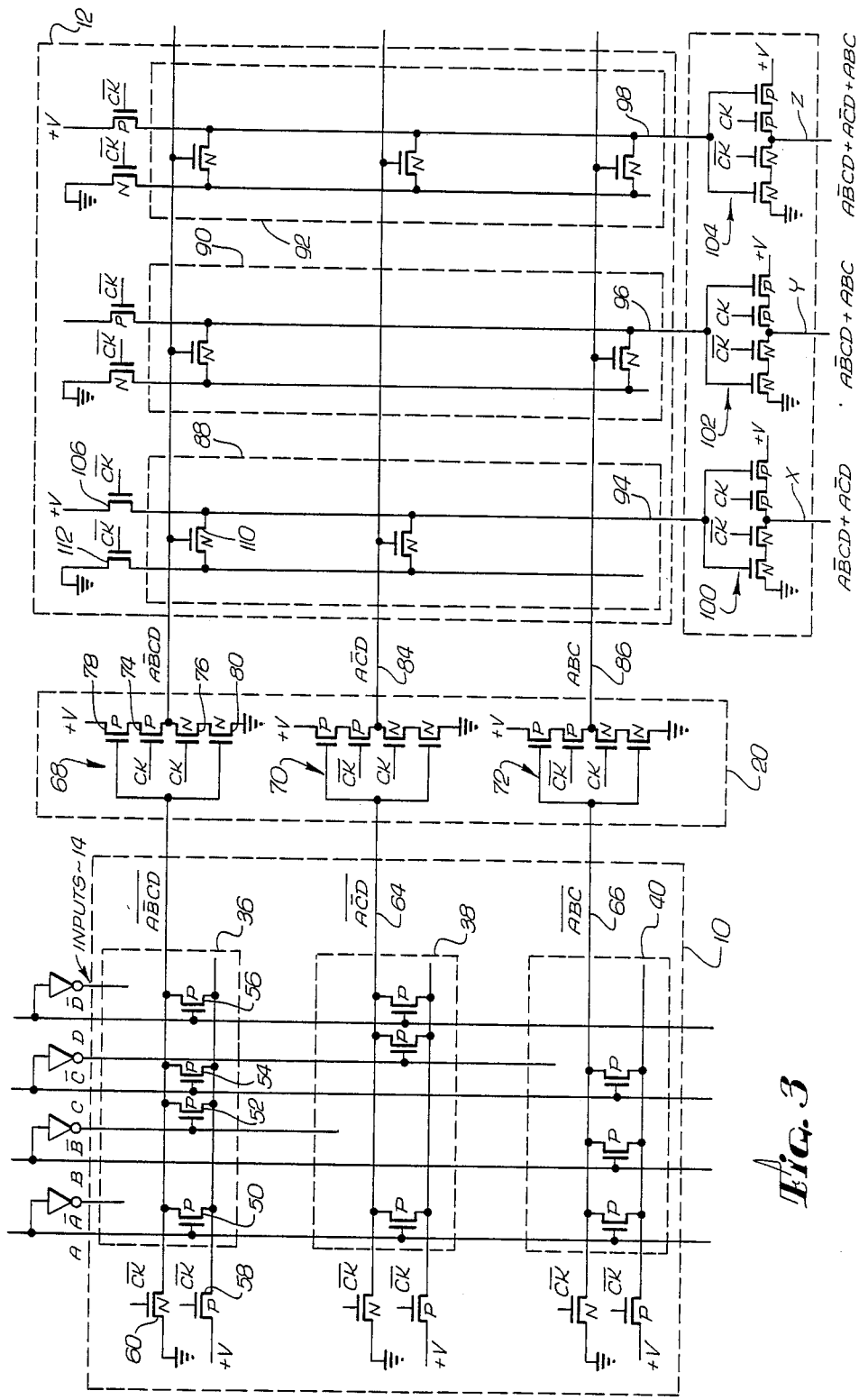
FIG. 3 is a detailed schematic drawing of a particular embodiment of the present invention wherein a specific logic equation is implemented by the PLA.
Figure 5:
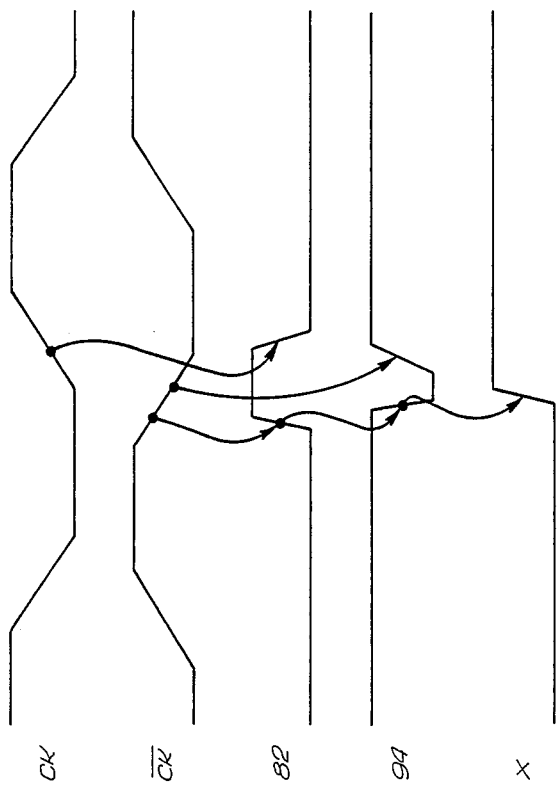
FIG. 5 is a timing diagram illustrating a potential race problem in the circuit of FIG. 3.

In FIG. 3, a detailed schematic drawing is shown for a specific example of a four input, three output PLA embodying the present invention. The PLA shown in FIG. 3 receives four input logic signals denoted A, B, C, D and their complements $\overline{A}, \overline{B}, \overline{C}$ and $\overline{D}$ and provides three outputs X, Y and Z implementing the following three logic equations:

$$X = (A \cdot \overline{B} \cdot C \cdot D) + (A \cdot \overline{C} \cdot D)$$
$$Y = (A \cdot \overline{B} \cdot C \cdot D) + (A \cdot B \cdot C)$$
$$Z = (A \cdot \overline{B} \cdot C \cdot D) + (A \cdot \overline{C} \cdot D) + (A \cdot B \cdot C)$$

In the specific embodiment shown in FIG. 3, NAND plane 10 comprises three separate logic gates 36, 38 and 40 for performing the NAND logic operation on logic signals A, $\overline{B}$, C, D, signals A, $\overline{C}$, D and signals A, B, C, respectively.

As may be seen from inspection of FIG. 3, the logic gates 36, 38, 40 each comprise a block of p transistors clocked by $\overline{CK}$ in the manner shown in FIG. 2. For example, logic gate 36 employs p channel transistors 50, 52, 54 and 56. P channel transistors 50, 52, 54 and 56 are clocked in precharge and evaluate modes by clock signal $\overline{CK}$ as applied to p channel evaluate transistor 58, coupled to voltage supply +V, and n channel precharge transistor 60, coupled to ground. When $\overline{CK}$ is high p channel transistors 50, 52, 54 and 56 have their output line 62 precharged to a low logic level. This is due to precharge n channel transistor 60 being placed in a conductive state by the high $\overline{CK}$, thereby pulling line 62 down to ground. When $\overline{CK}$ goes low, p channel transistors 50, 52, 54 and 56 are evaluated, i.e. their outputs are determined from the input signals applied to their gates. Specifically, depending on the values of inputs A, $\overline{B}$, C and D applied to p channel transistors 50, 52, 54, 56, the output on line 62 will either be pulled up to +V (high) or remain at the precharged low value. It may be seen by preparing a logic table for the inputs A, $\overline{B}$, C, D and the output provided on line 62 that the output on line 62 represents the logical NAND operation on A, $\overline{B}$, C, D as inputs, i.e. the output on line 62 during the evaluation phase will be $\overline{A \cdot \overline{B} \cdot C \cdot D}$. Similarly, logic gate 38 provides a logic signal on line 64 corresponding to $\overline{A \cdot \overline{C} \cdot D}$ and logic gate 40 provides a signal on line 66 corresponding to $\overline{A \cdot B \cdot C}$.

Figure 4:
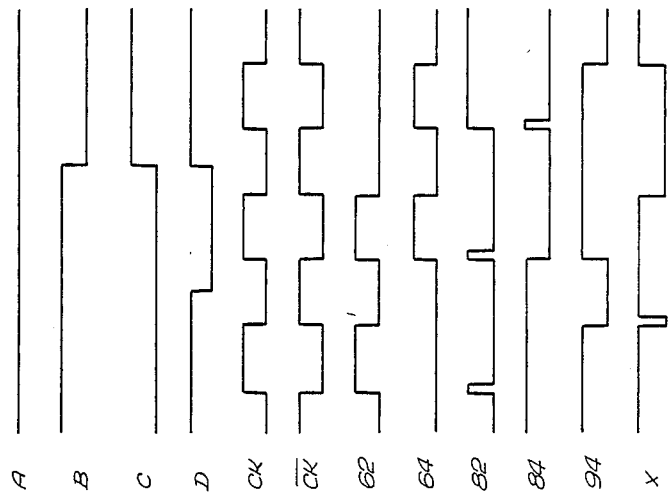
FIG. 4 is a timing diagram showing the operation of the circuit of FIG. 3.

The timing relationship of the output on lines 62 and 64 with respect to the values of inputs A, B, C and D is shown in FIG. 4. Note, however, that the signals CK and $\overline{CK}$ are shown with corresponding ideal transition edges. As will be discussed below, in a practical application the clock edges are not ideal. Therefore, as discussed below, $\overline{CK}$ is provided with a slight delay with respect to CK to avoid race problems.

During the evaluation phase of NAND plane 10, the outputs from logic gates 36, 38 and 40 are provided to clocked latch/inverters 68, 70 and 72, respectively. Each of the latch/inverters 68, 70 and 72 have the same structure. For example, latch/inverter 68 includes a clocked p channel transistor 74 and a clocked n channel transistor 76 clocked by $\overline{CK}$ and CK, respectively. Latch/inverter 68 further includes a p channel transistor 78 coupled to the voltage supply +V and an n channel transistor 80 coupled to ground. Both transistors 78 and 80 receive the output of logic gate 36 provided along line 62 to the gates thereof.

When the NAND gate is in the evaluate mode, i.e. $\overline{CK}$ low, the two clocked transistors 74 and 76 of latch/inverter 68 will be in a conductive state and latch/inverter 68 will operate as an inverter gate. Therefore, latch/inverter 68 will provide a logic signal on line 82 corresponding to $A \cdot \overline{B} \cdot C \cdot D$, i.e. the inverted or complement signal of that supplied along line 62. Similarly, during the NAND plane evaluate clock phase, latch/inverter 70 provides a signal $A \cdot \overline{C} \cdot D$ along line 84 and latch/inverter 72 provides signal $A \cdot B \cdot C$ along line 86. When the clock signal $\overline{CK}$ goes high and CK goes low, p channel transistor 74 and n channel transistor 76 go nonconductive and latch the logic value on line 82 at its value during the evaluate phase. This latched logic value on line 82 is held by the capacitance of the transistors in latch 68 during this clock cycle of CK low, $\overline{CK}$ high. Similarly, latch/inverters 70, 72 latch the logic values on lines 84 and 86 respectively during the clock cycle CK low, $\overline{CK}$ high.

The specific implementation of the NOR plane 12 in the illustrative embodiment of FIG. 3 employs three dynamic NOR gates 88, 90 and 92. NOR gates 88, 90 and 92 are clocked in a similar manner to the logic gates in NAND plane 10 except that the NOR gates 88, 90 and 92 are precharged when $\overline{CK}$ is low and evaluated when CK is high. In other words, NOR gates 88, 90 and 92 are evaluated and precharged during opposite clock phases from the logic gates in NAND plane 10. Therefore, when the inverted outputs of the NAND plane 10 are latched in latch/inverters 68, 70 and 72, NOR gates 88, 90 and 92 will evaluate these logic values, i.e. perform the NOR logic operation on the selected lines. Specifically, NOR gate 88 will perform the NOR operation on logic values latched on lines 82 and 84, NOR gate 90 will NOR the logic values on lines 82 and 86, and NOR gate 92 will NOR the logic values on lines 82, 84 and 86. The results of these NOR logic operations will be provided during the NOR plane evaluation phase on lines 94, 96 and 98 respectively.

The latching of the signals on lines 82, 84 and 86 allows these latched logic values to be evaluated by NOR plane 12 without spurious logic values appearing due to conventional clock race conditions. For example, referring to FIG. 4 it can be seen that spurious logic values appear on line 82 during transition from precharge to evaluate clock phases of the NAND plane. The NOR plane does not evaluate at these phases of the clock signal, however, and evaluation of these spurious logic values is avoided. This is an illustration that the implementation of FIGS. 2 and 3 represents a specific subset of the so-called NORA (NO RAce) logic or n-p CMOS dynamic logic.

The NOR plane 12 output logic values provided along lines 94, 96 and 98 are in turn inverted and latched by a second group of latch/inverters 22. These latch/inverters, 100, 102, 104 respectively, operate in the same manner as latch/inverters 68, 70 and 72, however, they are latched during clock signal CK low and $\overline{CK}$ high, i.e. during the evaluate phase of NOR plane 12. This second group of latch/inverters 22 thus provides latched logic signals on lines X, Y and Z. The latching function of latch/inverter 22 enables the outputs provided on lines X, Y and Z to be optionally fed back as inputs to NAND plane 10 to be evaluated during the evaluate phase of NAND plane 10. This enables the PLA to operate as a finite state machine if desired.

The output logic signals on lines X, Y and Z correspond to the following logic relationship with A, B, C and D:

$$X = (A \cdot \overline{B} \cdot C \cdot D) + (A \cdot \overline{C} \cdot D)$$
$$Y = (A \cdot \overline{B} \cdot C \cdot D) + (A \cdot B \cdot C)$$
$$Z = (A \cdot \overline{B} \cdot C \cdot D) + (A \cdot \overline{C} \cdot D) + (A \cdot B \cdot C)$$

Thus, the outputs latched on lines X, Y and Z correspond to the logic equations desired to be implemented on the inputs A, B, C and D.

The aforementioned CMOS PLA structure will operate without race conditions in the circuit so long as the transistors have switching characteristics which are sufficiently fast. As discussed above, however, the field effect transistors will not operate in an ideal manner and potential race problems are possible if the switching characteristics are sufficiently slow in relation to the speed of the circuit. As a practical matter, this type of potential race problem resulting from non-ideal switching characteristics of the FETs in the circuit restricts the operating point (voltage range, temperature range, tolerance to processing) of the circuit.

The nature of such race problems may be understood by discussion of two potential race conditions in the circuit of FIG. 3. For example, in relation to the NAND gate 36 one type of potential race exists when $\overline{CK}$ transitions from a low to high value causing n channel precharge transistor 60 to become conductive thereby pulling output line 62 to ground (low). Due to the non-ideal switching characteristics of the transistors it is possible for p channel transistor 74 to be still conductive at this point in time thereby pulling the output from the inverter 68 high on line 82. Since the transition $\overline{CK}$ high will result in latch/inverter 68 being in its latched state, the spurious high value on line 82 will be latched. This latched spurious high value on line 82 may then be evaluated by the NOR plane 12 leading to an erroneous logic output. A similar "precharge race" phenomenon can occur on the transition of $\overline{CK}$ from high to low in the NOR plane. For example, in relation to the NOR gate 88 it may be seen that during the high to low transition of $\overline{CK}$, p channel precharge transistor 106 will start to become conductive precharging output line 94 high before n channel transistor 108 in latch/inverter 22 has turned completely off. This will allow the output on line X to be pulled to ground (low) before latch/inverter 100 becomes fully latched. Therefore, a low level will be latched on output line X from latch/inverter 100 due to the delay in n channel transistor 108 switching off. This may result in an erroneous logic output from the PLA on line X.

These two examples of potential race problems due to the non-ideal switching characteristics of the field effect transistors illustrate why they may be referred to as "precharge" races. These race conditions may arise where a p channel precharge transistor controlled by a clock signal turns on before an n channel transistor controlled by the same clock signal fully switches off. Similarly, this race condition can result when an n channel precharge transistor begins turning on before the p channel transistor coupled thereto is fully turned off. It thus may be appreciated that it is the occurrence of precharge transistors turning on before dynamic logic transistors to which they are connected turn off that causes this race condition. In this regard, the term precharge transistor refers to those clocked transistors which are not involved in logic evaluation directly but rather are used to initialize an output line. In other words, the precharge transistors are those n or p channel transistors directly coupled to a logic output line which directly couple the output line to ground or +V to thereby precharge the output line to a low or high value, respectively.

In the preferred embodiment of the present invention the precharge race problems resulting from the non-ideal switching characteristics of the transistors have been overcome by slowing the switching speed of the precharge transistors with respect to that of the logic transistors in the logic gates in the circuit. This may be done, for example, by using long, narrow field effect transistors for all precharge transistors. It will be appreciated of course that other means may be employed to delay slightly the switching of the precharge transistors to allow the dynamic logic transistors to which they are coupled to fully switch off before these precharge transistors are turned on. In the specific example of FIG. 3, and in particular NAND gate 36 and NOR gate 88, precharge n channel transistor 60 and precharge p channel transistor 106 could be made relatively longer and more narrow than the remaining transistors in NAND gate 36 and NOR gate 88 to avoid the aforedescribed race condition.

As discussed above, a second type of race condition referred to as a "latch sample" race, may also arise in the PLA circuit due to the non-ideal switching characteristics of the transistors. Again, this type of race condition may be understood by reference to the detailed embodiment illustrated in FIG. 3. For example, as $\overline{CK}$ transitions from high to low during the sample cycle of latch/inverter 68, output line 82 will initially be driven to a high level irrespective of its desired state at the end of the sample cycle. This is due to the logic value of line 62 still being at its precharged low level at this time. This momentary high level on line 82 will cause n channel transistor 110 to become conductive. Since $\overline{CK}$ is in the process of a transition from a high to low value, the n channel transistor 112 will still be partially conductive due to its finite switching time, thereby causing the output on line 94 to be pulled low. If the clock signal CK has not yet completed its transition from low to high at this time, the momentary high level on line 94 will cause a high value to appear on output line X and be latched there as CK and $\overline{CK}$ complete their transition and latch clocked inverter 100. The same type of race condition occurs during the sample cycle of the NOR plane as $\overline{CK}$ transitions from low to high. At this time output line X is immediately driven low while at the same time one or more of p channel transistors 50, 52, 54 or 56 may become conducting and generate a positive going pulse on output line 62 from NAND gate 36. Once again, if CK does not transition low before $\overline{CK}$ transitions high, the positive going pulse on NAND gate output line 62 may result in a false low state being latched on latch/inverter 68 at output line 82. This "latch sample" race is illustrated by the expanded timing diagram of FIG. 5 which exaggerates the clock transition edges to illustrate this race condition.

In the preferred embodiment of the present invention this second type of race condition has been eliminated by employing a complement clock signal $\overline{CK}$ which is an appropriate delay from the clock signal CK. This guarantees that CK will transition before $\overline{CK}$ thereby avoiding the second type of race condition described above. In a straightforward implementation of such a delay, the complement clock signal $\overline{CK}$ is generated from the clock signal CK by means of a three inverter system 42 as shown in FIG. 2.

It will be appreciated that the present invention provides a racefree PLA structure while only requiring a single clock signal to synchronize the logic operations of both the NAND plane and NOR plane. A complement clock signal required for synchronizing the latch/inverters may be simply provided by a three inverter gate delay line from the clock signal. This, in combination with the delayed precharge transistors allows race-free operation of the circuit irrespective of non-ideal switching characteristics of the transistors and irrespective of non-ideal clock transition edges.

It may be appreciated that these characteristics of the PLA of the present invention are made possible by employing a specific subset of n-p CMOS dynamic logic design rules. These design rules require that one logic plane employ n channel transistors while the other logic plane employ p channel transistors, with both planes synchronized by a single clock signal. While one or the other of the race conditions discussed above may be eliminated by employing a more general form of n-p CMOS dynamic logic design, elimination of both race conditions is not possible by the general use of n-p CMOS dynamic logic.

It should be appreciated that while this specific form of n-p CMOS dynamic logic, in combination with a delayed complement clock signal and delayed precharge transistors, has been described in relation to a PLA circuit, it is equally applicable to other logic circuits in which such potential race conditions could arise. The present invention illustrated implemented in an embodiment of a PLA structure thus extends to other logic circuits too numerous to enumerate here.

Additionally, it should be appreciated that while the illustrated embodiment of a PLA employing the present invention has been described in terms of a NAND logic plane and a NOR logic plane, the present invention is equally applicable to PLAs employing other combinations of logic planes. Similarly, while the illustrated PLA has been shown with the NAND plane and NOR plane clocked on specific phases of a complement clock signal, the designation of the signal as a "complement" is arbitrary and has only been employed to indicate its derivation from a clock signal by means of an inversion and a delay. The "complement" clock signal may be generated by other means, however, as long as the delayed transition relationship with the other clock signal is maintained. Furthermore, it will be appreciated that the specific choice of p and n channel transistors shown in the preferred embodiments may be interchanged without departing from the scope of the present invention.

It will be apparent to one skilled in the art that other changes in the details of the preferred embodiments described above may be made and such alternate embodiments are within the scope of the present invention. Thus, the present invention is not intended to be limited to the above described preferred embodiment and is instead best described by the following claims.

What is claimed is:

1. A CMOS circuit employing dynamic logic, comprising:

clock means for supplying a clock signal;
complement clock means for supplying a complement clock signal having delayed transitions with respect to said clock signal;
first logic means, coupled to said complement clock means and comprising one or more logic gates of transistors of a first conductivity type, for receiving one or more externally provided input logic signals and performing first predetermined logic operations thereon and for providing first logic output signals corresponding to said logic operations performed on said input logic signals, wherein the timing of said first logic operations are controlled by said complement clock signal;
latch means, comprising transistors of said first conductivity type and a second conductivity type, for receiving said first logic output signals from said first logic means and latching said first logic output signals during a predetermined phase of said clock signal and the corresponding complement phase of said complement clock signal;
second logic means, coupled to said clock means and comprising one or more logic gates of transistors of said second conductivity type, for receiving one or more of said latched first logic output signals and performing second predetermined logic operations thereon and for providing the result of said second logic operations as second logic output signals, wherein said second predetermined logic operations are synchronized by said complement clock signal; and
each of said first logic means and said second logic means further comprising at least one precharge transistor and one evaluate transistor, said precharge transistors having switching characteristics slightly slower than the transistors employed in said logic gates and said latch means.

2. A circuit as set out in claim 1 wherein said first conductivity type is p type doped silicon and said second conductivity type is n type doped silicon.

3. A logic circuit as set out in claim 1 wherein said first conductivity type is n type doped silicon and said second conductivity type is p type doped silicon.

4. A programmable logic array as set out in claim 1 wherein said complement clock signal corresponds to the clock signal passed through a series of three inverter gates.

5. A logic circuit as set out in claim 1 wherein in said first logic array means said logic gates are precharged to predetermined outputs during a first phase of said complement clock signal and the logic states of said logic gates are evaluated during a second phase of said complement clock signal and wherein in said second logic array means said logic gates are precharged during said second phase of said complement clock signal and the logic states of said logic gates are evaluated during said first phase of said complement clock signal.

6. A logic circuit as set out in claim 1 wherein said transistors are field effect transistors and said precharge transistors are longer and narrower than the transistors comprising said logic gates.

7. A programmable logic array implemented in a complementary metal oxide semiconductor integrated circuit having a first voltage source and a second voltage source, comprising:
- a plurality of inputs for receiving a plurality of input logic signals;
- clock means for providing a single clock signal and a single complement clock signal said clock signal having transitions delayed slightly from the transitions of said complement clock signal;
- first logic plane means for receiving said input logic signals and performing predetermined logic operations thereon and outputting a plurality of first output logic signals, said first logic plane means comprising:
  - one or more clocked precharge transistors of a first conductivity type, coupled to the first voltage source and receiving said clock signal, for selectively providing a conductive path to said first voltage source;
  - one or more clocked evaluate transistors of a second conductivity type, coupled to said second voltage source and receiving said clock signal, for selectively providing a conductive path to said second voltage source; and
  - a plurality of logic transistors, coupled to said precharge transistor and said evaluate transistor, for receiving selected ones of said input signals and outputting said first output logic signals;
- first latch means, responsive to said first output logic signals, said clock signal and said complement clock signal, for performing the logical inversion operation on said first output logic signals and outputting a plurality of latched output signals corresponding thereto; and
- second logic plane means for receiving said plurality of latched output signals, performing a second predetermined logic operation thereon and providing output logic signals, comprising:
  - one or more clocked precharge transistors and receiving said clock signal, for selectively providing a conductive path to said first voltage source or said second voltage source;
  - one or more clocked evaluate transistors receiving said clock signal, for selectively providing a conductive path to said first voltage source or said second voltage source; and
  - a plurality of logic transistors having a conductivity type opposite to said logic
  - transistors in said first logic plane and coupled to said precharge transistors and said evaluate transistors for receiving said latched output signals and providing said output logic signals; and
    - wherein said precharge transistors in said first logic plane means and said second logic plane means have slower switching response times than said logic transistors.

8. A programmable logic array as set out in claim 7 wherein said complement clock signal is a three inverter delay of said clock signal.

9. A CMOS programmable logic array comprising:
- a plurality of inputs for receiving a plurality of input logic signals;
- a source of clock signals;
- a source of complement clock signals having delayed transitions with respect to said clock signals;
- first logic plane means for performing first predetermined logic operations, comprising:
  - one or more precharge transistors responsive to said complement clock signals;
  - one or more evaluate transistors responsive to said complement clock signals; and
  - one or more logic gates of p channel transistors coupled to selected inputs; wherein said first logic plane means provides one or more first output signals corresponding to said predetermined logic operations performed on selected input logic signals;
- clocked latch means coupled to said clock signal and said complement clock signal for receiving said first output signals and latching said first output signals during successive phases of said clock signal and said complement clock signal;
- second logic plane means for performing second predetermined logic operations on said latched output signals and providing second output signals, comprising:
  - one or more precharge transistors responsive to said complement clock signals;
  - one or more evaluate transistors responsive to said complement clock signals; and
  - one or more logic gates of n channel transistors receiving selected latched output signals;
    - wherein said precharge transistors have slower switching times than said transistors comprising said logic gates.

10. A CMOS programmable array as set out in claim 9 further comprising second clocked latch means for receiving said second output signals and latching said second output signals during a predetermined phase of said clock signal.

* * * * *